(12) United States Patent
Den Boef et al.

(10) Patent No.: US 9,547,241 B2
(45) Date of Patent: Jan. 17, 2017

(54) ALIGNMENT SENSOR, LITHOGRAPHIC APPARATUS AND ALIGNMENT METHOD

(71) Applicant: ASML Netherlands B.V., Veldhoven (NL)

(72) Inventors: Arie Jeffrey Den Boef, Waalre (NL); Simon Gijsbert Josephus Mathijssen, Den Bosch (NL); Patricius Aloysius Jacobus Tinnemans, Hapert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/787,451

(22) PCT Filed: Apr. 25, 2014

(86) PCT No.: PCT/EP2014/058502
§ 371 (c)(1),
(2) Date: Oct. 27, 2015

(87) PCT Pub. No.: WO2014/180684
PCT Pub. Date: Nov. 13, 2014

(65) Prior Publication Data
US 2016/0077445 A1    Mar. 17, 2016

Related U.S. Application Data

(60) Provisional application No. 61/820,568, filed on May 7, 2013.

(51) Int. Cl.
*G03B 27/42* (2006.01)
*G03F 7/20* (2006.01)
(Continued)

(52) U.S. Cl.
CPC ......... *G03F 7/70141* (2013.01); *G01B 11/272* (2013.01); *G03F 9/7069* (2013.01); *G03F 9/7088* (2013.01); *G03F 9/7092* (2013.01)

(58) Field of Classification Search
CPC ..... G01B 11/272; G01B 11/002; G01B 11/26; G01B 11/27; G01B 11/026; G01B 21/24; G01B 7/31; G01B 9/02015; G03F 7/70141; G03F 9/7088; G03F 9/7046; G03F 9/7069; G03F 9/7011; G03F 9/7042; G03F 9/7076; G03F 7/70191; G03F 9/7003; G03F 9/7084

See application file for complete search history.

(56) References Cited

U.S. PATENT DOCUMENTS

| 5,160,849 A | 11/1992 | Ota et al. |
| 6,961,116 B2 | 11/2005 | Den Boef et al. |

(Continued)

FOREIGN PATENT DOCUMENTS

| CN | 1477448 | 2/2004 |
| CN | 1797204 | 7/2006 |

(Continued)

OTHER PUBLICATIONS

International Search Report and Written Opinion mailed Oct. 27, 2014 in Internatonal Patent Application No. PCT/EP2014/058502.
Jeroen Huijbregtse et al., "Overlay Performance with Advanced ATHENA™ Alignmant Strategies," Proc. of SPIE, vol. 5038, pp. 918-928 (2003).
Disclosed Anonymously, "Research Disclosure database No. 580057," Research Disclosure, The Industry Standard Disclosure Publication Service, pp. 1-5 (Aug. 2012).
Chinese Office Action dated Jun. 23, 2016 in corresponding Chinese Patent Application No. 2014800259033.

*Primary Examiner* — Mesfin Asfaw
(74) *Attorney, Agent, or Firm* — Pillsbury Winthrop Shaw Pittman LLP

(57) ABSTRACT

An alignment sensor including an illumination source, such as a white light source, having an illumination grating operable to diffract higher order radiation at an angle dependent on wavelength; and illumination optics to deliver the diffracted radiation onto an alignment grating from at least two opposite directions. For every component wavelength incident on the alignment grating, and for each direction, the zeroth diffraction order of radiation incident from one of the (Continued)

two opposite directions overlaps a higher diffraction order of radiation incident from the other direction. This optically amplifies the higher diffraction orders with the overlapping zeroth orders.

20 Claims, 6 Drawing Sheets

(51) Int. Cl.
*G03F 9/00* (2006.01)
*G01B 11/27* (2006.01)

(56) References Cited

U.S. PATENT DOCUMENTS

| | | |
|---|---|---|
| 7,626,701 B2 | 12/2009 | Van Bilsen |
| 8,208,121 B2 | 6/2012 | Bijnen et al. |
| 2006/0141374 A1 | 6/2006 | Van Bilsen |
| 2009/0195768 A1 | 8/2009 | Bijnen et al. |

FOREIGN PATENT DOCUMENTS

| | | |
|---|---|---|
| CN | 101165597 | 4/2008 |
| EP | 1 674 938 | 6/2006 |
| JP | H09-34134 | 2/1997 |

ALIGNMENT SENSOR, LITHOGRAPHIC APPARATUS AND ALIGNMENT METHOD

CROSS-REFERENCE TO RELATED APPLICATIONS

This application is the U.S. national phase entry of PCT patent application no. PCT/EP2014/058502, which was filed on Apr. 25, 2014, which claims the benefit of priority of U.S. provisional application No. 61/820,568, which was filed on May 7, 2013, and which is incorporated herein in its entirety by reference.

FIELD

The present invention relates to an alignment sensor and alignment method, such as that used in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of marks on a substrate can be measured accurately. These alignment sensors are effectively position measuring apparatuses. Different types of marks and different types of alignment sensors are known from different times and different manufacturers. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). The contents of both of these applications are incorporated herein by reference.

A current alignment technique comprises illuminating the alignment mark and obtaining an interference pattern from the $+1^{st}$ and $-1^{st}$ diffractive orders, with the $0^{th}$ order being blocked. This is sometimes referred to as dark field detection. However, the $1^{st}$ order diffraction efficiency of alignment marks is tending to become smaller (as the alignment mark contrast is becoming lower), meaning that the $1^{st}$ order signals are increasingly weaker. In addition to this, there is a growing need to measure each alignment mark in a shorter time. Shot-noise limited detection of such weak signals in a short time therefore becomes impossible without impractically powerful lasers. Another limitation of dark-field detection is its limited capability to detect asymmetric deformation of an alignment mark. Processing steps like etch and Chemical Mechanical Polishing (CMP) can deform the mark which leads to an alignment offset. Detection of this deformation is of value and can be done by measuring an intensity imbalance between the $+1^{st}$ and $-1^{st}$ order. In dark field detection, however, these orders are added which makes it impossible to detect the asymmetry.

SUMMARY

It is desirable to provide an alignment sensor which is able to measure a low contrast grating at high speed. It is also desirable to detect the presence of asymmetric deformation of a grating in a very simple way.

According to an aspect of the invention, there is provided an alignment sensor comprising:
at least one illumination source comprising a diffractive illumination structure operable to diffract higher order radiation at an angle dependent on wavelength; and
illumination optics being operable to deliver said diffracted illumination radiation from said at least one illumination source onto a point on an diffractive alignment structure from at least a pair of opposite azimuthal directions, wherein said alignment sensor is operable such that following diffraction of said illumination radiation by said diffractive alignment structure, and independent of the wavelength or wavelengths comprised in said illumination radiation:
the zeroth diffraction order of radiation incident from a first of each pair of opposite azimuthal directions overlaps a higher diffraction order of radiation incident from a second of each pair of opposite azimuthal directions; and
the zeroth diffraction order of radiation incident from the second of each pair of opposite azimuthal directions overlaps a higher diffraction order of radiation incident from the first of each pair of opposite azimuthal directions;
thereby optically amplifying said higher diffraction orders with the overlapping zeroth orders.

According to a further aspect of the invention, there is provided a method of performing an alignment operation on a substrate, said substrate comprising at least one diffractive alignment structure, said method comprising:
illuminating an diffractive illumination structure with illumination radiation; and
receiving diffracted illumination radiation from said diffractive illumination structure and directing it onto a point on said diffractive alignment structure from at least a pair of opposite azimuthal directions, such that following diffraction of said radiation by said diffractive alignment structure, and independent of the wavelength or wavelengths comprised in said illumination radiation:
the zeroth diffraction order of radiation incident from the first of each pair of opposite azimuthal directions overlaps a higher diffraction order of radiation incident from the second of each pair of opposite azimuthal directions and
the zeroth diffraction order of radiation incident from the second of each pair of opposite azimuthal directions overlaps a higher diffraction order of radiation incident from the first of each pair of opposite azimuthal directions;

thereby optically amplifying said higher diffraction orders with the overlapping zeroth orders.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
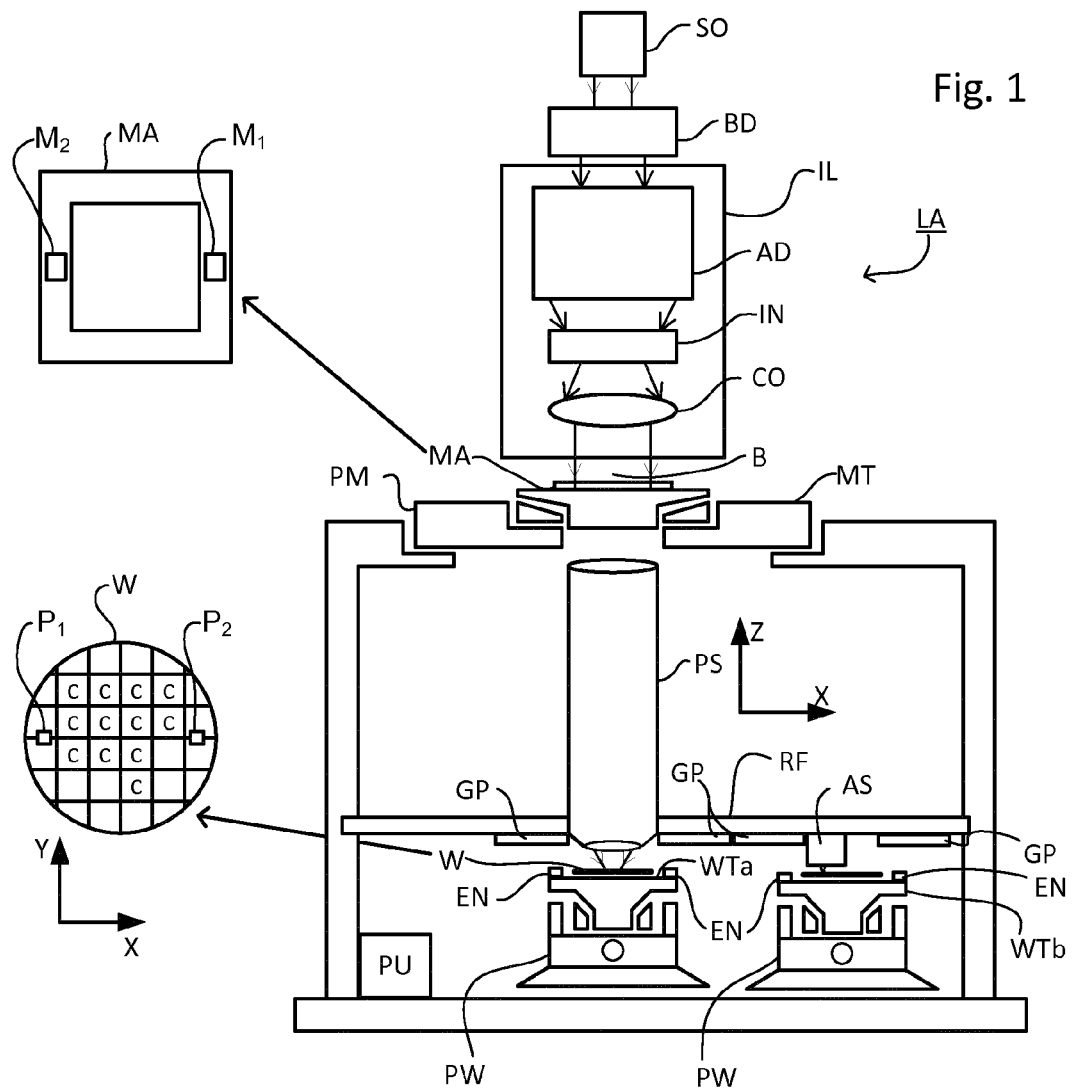
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor (not shown) and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
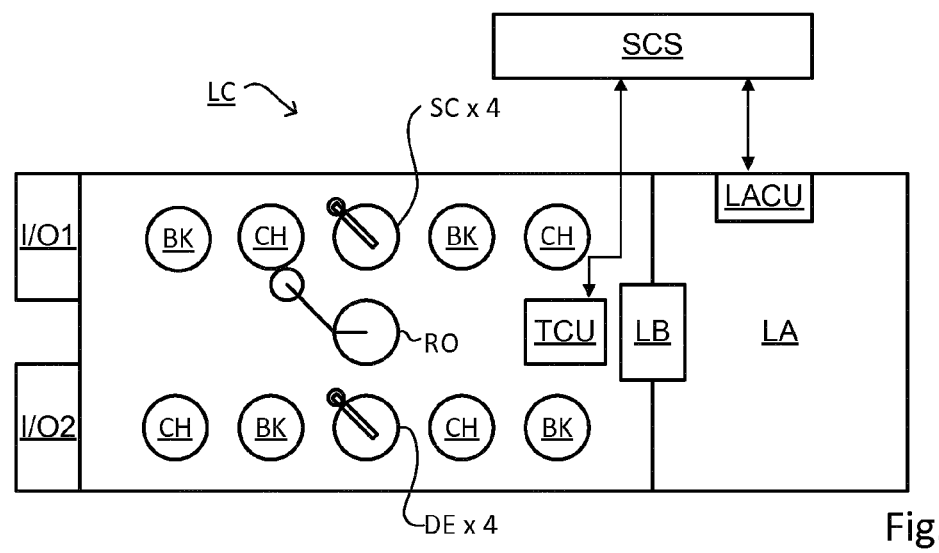
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to control the lithographic process to place device features accurately on the substrate, alignment marks are generally provided on the substrate, and the lithographic apparatus includes one or more alignment sensors by which positions of marks on a substrate can be measured accurately. These alignment sensors are effectively position measuring apparatuses. Different types of marks and different types of alignment sensors are known from different times and different manufacturers. A type of sensor widely used in current lithographic apparatus is based on a self-referencing interferometer as described in U.S. Pat. No.

6,961,116 (den Boef et al). Generally marks are measured separately to obtain X- and Y-positions. However, combined X- and Y-measurement can be performed using the techniques described in published patent application US 2009/195768 A (Bijnen et al). The contents of both of these applications are incorporated herein by reference.

Advanced alignment techniques using a commercial alignment sensor are described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003). These strategies can be extended and applied commercially in sensors of the type described by US'116 and US'768, mentioned above. A feature of the commercial sensors is that they measure positions using several wavelengths (colors) and polarizations of radiation (light) on the same target grating or gratings. No single color is ideal for measuring in all situations, so the commercial system selects from a number of signals, which one provides the most reliable position information.

Figure 3:
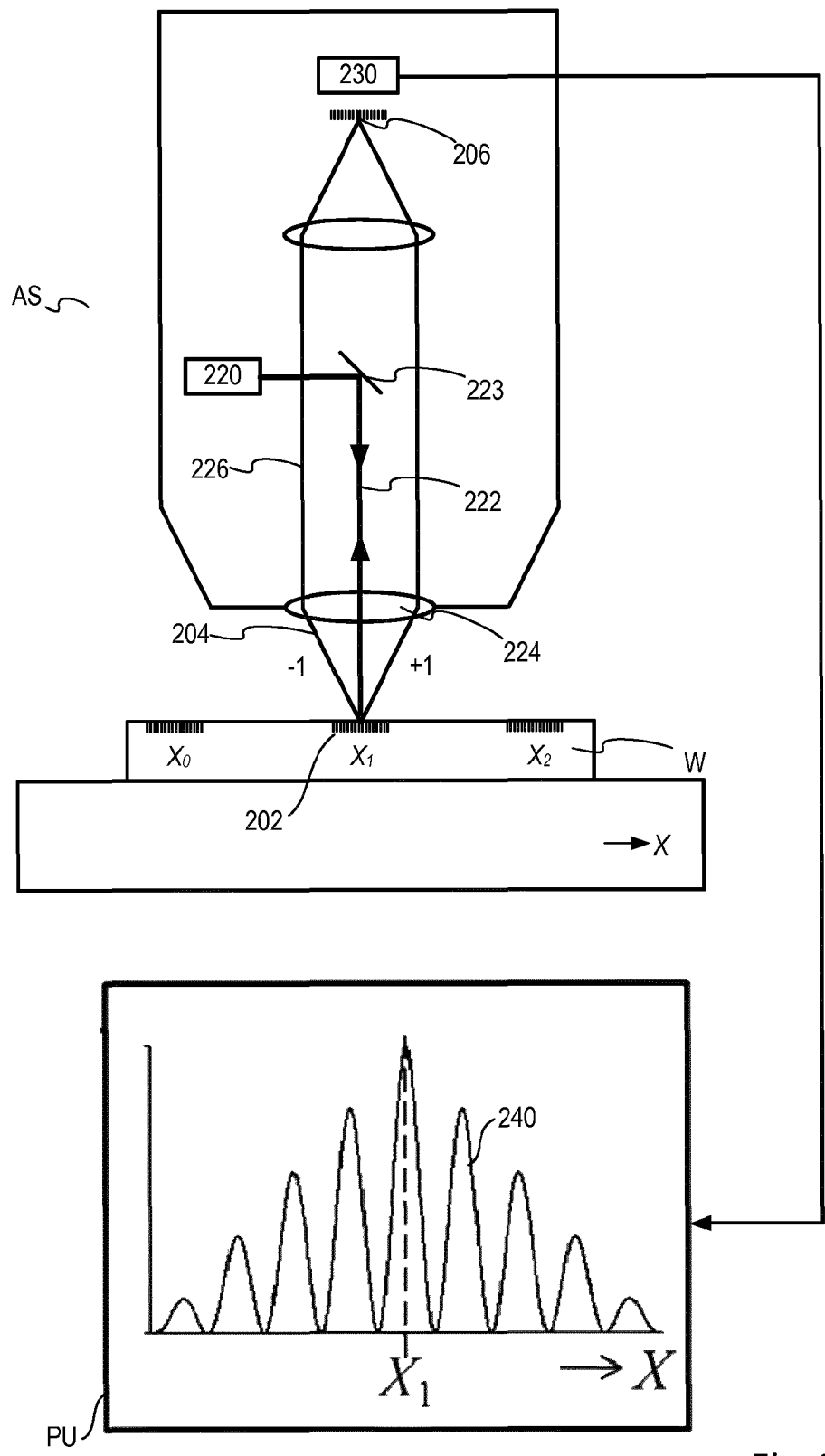
FIG. 3 depicts a known alignment sensor.

FIG. 3 is a schematic block diagram of a known alignment sensor AS. Illumination source 220 provides a beam 222 of radiation of one or more wavelengths, which is diverted by a spot mirror 223 through an objective lens 224 onto a mark, such as mark 202, located on substrate W. Radiation 204 scattered by mark 202 is picked up by objective lens 224 and collimated into an information-carrying beam 226. This information-carrying beam 226 is used to measure the location of the mark 202 with respect to a reference point in the sensor. This reference point can be a grating 206 or the "neutral line" in a self-referencing interferometer. Detector 230 detects the resultant signals 240. Spot mirror 223 serves conveniently as a zero order stop at this point, so that the information carrying beam 226 comprises only higher order diffracted radiation from the mark 202 (This is often referred to as "dark field" measurement). Intensity signals 240 from individual sensors in sensor grid 230 are provided to a processing unit PU, from which values for X- and Y-position on the substrate are output. Alternatively, detector 230 may be a single photodiode, and the grating 206 have the same pitch as the image that is imaged onto it. The amount of radiation transmitted by the grating 206 varies as the alignment grating is scanned in the X-direction.

Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

Increasingly, many lithographic processes use alignment gratings that have a very low optical contrast due to an absorbing layer or process segmentation. As a result, the grating has a very low 1st order diffraction efficiency $A_1$, $A_{-1}$. Using current dark field methods, the detected signal level equals $|A_1|^2+|A_{-1}|^2+2|A_1||A_{-1}|\cos(\phi_1-\phi_{-1})$ where $\phi_1$ and $\phi_{-1}$ are the phases of, respectively the $+1^{st}$ and $-1^{st}$ order. It can be seen that the signal level scales approximately with $|A_1|^2$ (depending on the grating depth). This signal is normally detected using a transimpedance amplifier where the photocurrent is sent through a resistor. In order to achieve shot-noise-limited detection, a very high feedback resistor is required, which limits the maximum signal bandwidth due to the presence of a small parasitic capacitance across the feedback resistor.

In addition to this, there is an increasing need to measure more alignment gratings so as to properly capture wafer deformation. In order to measure many alignment targets on the wafer while maintaining throughput, the alignment scan speed needs to increase significantly (in the order of 100 times faster, from 10 mm/s typically used presently, to 1 m/s or faster). This increases the alignment signal frequency to the MHz range. This, however, cannot be detected with the high feedback resistor that is needed for shot-noise limited detection.

Another drawback of the dark field method is that the detected signal is comprised of the $+1^{st}$ and $-1^{st}$ diffraction orders interfered together, and therefore grating asymmetry information cannot easily be obtained without dedicated apparatus.

Figure 4:
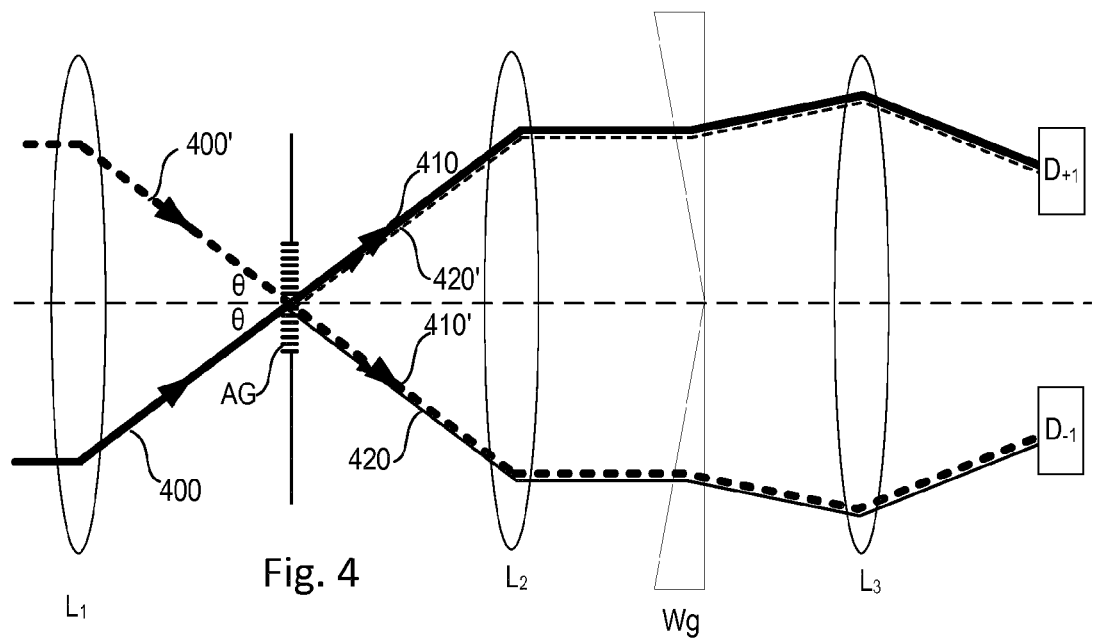
FIG. 4 depicts an alignment sensor operable to use homodyne detection techniques to amplify higher order diffracted radiation.

FIG. 4 shows an arrangement which aims to address the above issues. It uses homodyne detection techniques to optically amplify each of the $1^{st}$ order diffraction signals separately. In the specific arrangement shown there are two coherent beams 400, 400' (which may be obtained from a single off-axis illumination source) which are delivered and focused via illumination optics which comprise lens $L_1$ onto a diffractive alignment structure, such as an alignment grating AG. The angle of incidence θ of the beams 400, 400' are equal, but are incident in opposite azimuthal directions, such that if beam 400 is incident at an azimuthal angle φ, beam 400' is incident at an azimuthal angle φ+180°. For clarity the alignment grating AG is shown here as transmissive, but in real alignment applications reflective gratings will be used. The pitch P of the alignment grating AG and the wavelength λ of the illumination beams are chosen in such a way that they satisfy the relation:

$$\frac{\lambda}{P} = 2\sin(\theta)$$

For this particular illumination condition the resulting $0^{th}$ order radiation and the $1^{st}$ order radiation will overlap coherently and propagate in the same direction. As a result the $1^{st}$ order radiation is optically amplified by the $0^{th}$ order radiation. In the drawing, beam 400, and its resultant diffracted beams 410, 420, are shown as a solid line; and beam 400', and its resultant diffracted beams 410', 420', are shown as a dotted line. The strong $0^{th}$ order beams 410, 410' are depicted using a thicker line, and each has complex amplitude $A_0$. The much weaker $\pm1^{st}$ order beams 420, 420' are depicted using thinner lines, and each has complex amplitudes $A_{\pm1}$.

The lenses $L_2$ and $L_3$ create an image of the alignment grating AG on detectors $D_{-1}$ and $D_{+1}$. The wedges Wg ensure that 2 spatially separated images are formed. The intensities on the detectors $D_{-1}$ and $D_{+1}$ are, respectively:

$$I_{-1} = |A_0 + A_{-1}|^2 = |A_0|^2 + |A_{-1}|^2 + 2|A_{-1}||A_0|\cos\left(\Phi - 2\pi\frac{x}{P}\right)$$

$$I_{+1} = |A_0 + A_1|^2 = |A_0|^2 + |A_1|^2 + 2|A_1||A_0|\cos\left(\Phi + 2\pi\frac{x}{P}\right)$$

Here the phase term Φ is the phase difference between the $0^{th}$ order radiation and the $\pm1^{st}$ order radiation for x=0. This phase difference is π/2 for shallow phase gratings with a low optical contrast. Subtracting the two intensities yields:

$$I_{-1} - I_{+1} = 4|A_1||A_0|\sin(\Phi)\sin\left(2\pi\frac{x}{P}\right) = 4|A_1||A_0|\sin\left(2\pi\frac{x}{P}\right)$$

This detected difference signal yields an alignment signal which scales with $|A_0||A_1|$ rather than $|A_1|^2$ as in the case of "classical" phase grating alignment. This yields a significant optical amplification which allows photon-limited detection at high alignment scan speeds. Where amplitude gratings are used, the $I_{-1}$ and $I_{+1}$ intensities can be added together to find position.

It is also possible to determine a position from the $I_{-1}$ and $I_{+1}$ intensities separately. The final position will then be given by the mean of these individual two positions. This method has the advantage of being less sensitive to alignment grating asymmetry. Also as the $+1^{st}$ and $-1^{st}$ orders are detected separately, it is simple to detect and measure this asymmetry.

However, this specific arrangement lacks flexibility. With a fixed grating pitch P and angle of incidence θ, the arrangement will only work for a single wavelength λ. A feature of present commercial sensors is that they measure positions using several wavelengths (colors) and polarizations of radiation (light) on the same target grating or gratings. No single color is ideal for measuring in all situations, so the commercial system selects from a number of signals, the one which provides the most reliable position information.

Figure 5:
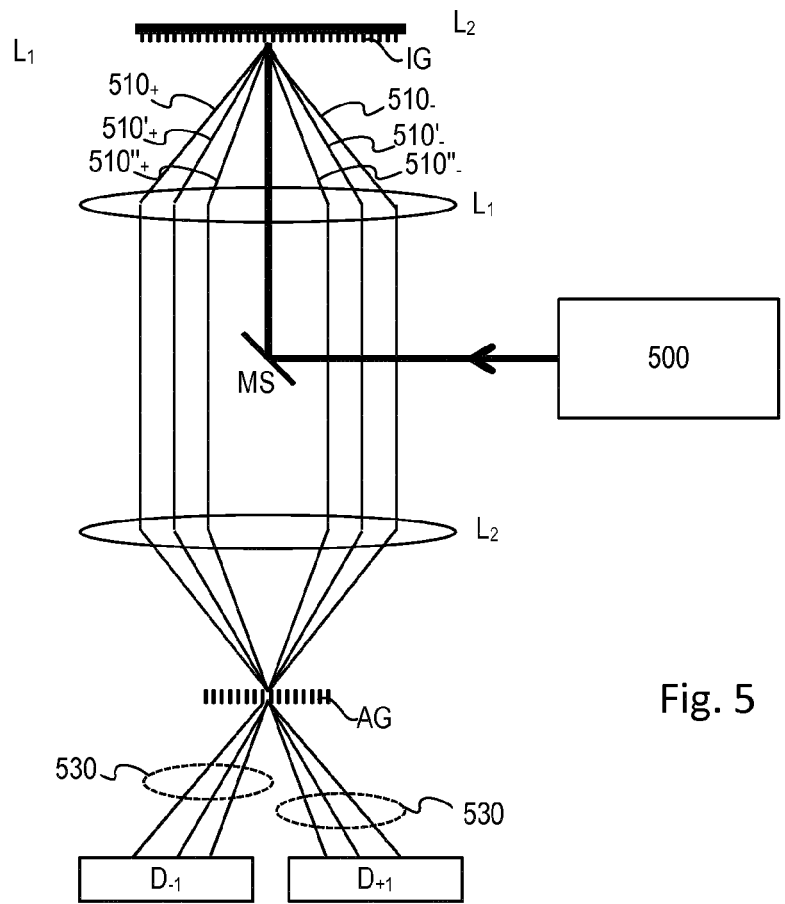
FIG. 5 depicts an alignment sensor according to a first embodiment of the invention.

FIG. 5 shows a variation on the arrangement of FIG. 4 which addresses the single wavelength limitation of the FIG. 4 embodiment, and therefore allows a white-light illumination source 500 to be used (or a source of any wavelength). In this arrangement the illumination source (here a while-light source) is used to illuminate a diffractive illumination structure, such as illumination grating IG. The illumination grating IG has a pitch 2P when the pitch of the alignment grating AG is P. The illumination grating IG diffracts the incident radiation at an angle dependent on its wavelength. Shown are the $+1^{st}$ and $-1^{st}$ diffraction orders of radiation of three wavelengths 510, 510', 510" of which the white light was composed (of course this is purely illustrative and the white light source 500 may comprise radiation of many more wavelengths). The $0^{th}$ order radiation from the illumination grating IG is blocked by mirror/stop MS. illumination optics such as lenses $L_1$ and $L_2$, in combination with the stop MS, create a dark-field image of the illumination grating IG with unit magnification, on the alignment grating AG.

As with the arrangement of FIG. 4, radiation is applied from (at least) two opposite azimuthal directions. However, in this case the radiation from each azimuthal direction now comprises radiation of a number of different wavelengths, each of these wavelengths being incident at a different angle of incidence θ (with the angle of incidence θ being a function of each component wavelength λ). Furthermore, where the illumination grating IG has a pitch twice that of the pitch P of the alignment grating AG, it can be shown that the relationship:

$$\frac{\lambda}{P} = 2\sin(\theta)$$

is satisfied for all wavelengths λ. Therefore, for the radiation diffracted from alignment grating 530, the weak $1^{st}$ order radiation is coherently added to strong $0^{th}$ order radiation for every color. While optical amplification of the $1^{st}$ order radiation is described it should be appreciated that any higher order may be optically amplified by this method.

Of course, a single wavelength source may be used, the arrangement working regardless of the wavelength of the source.

The optically amplified radiation 530 is detected by detectors $D_{+1}$, $D_{-1}$. In most practical applications these detectors will contain additional optics to allow wavelength-resolved detection of the homodyne signals.

While radiation from just two opposing azimuthal directions is shown in the above example, it is possible to use a total of 2N illumination beams where N beams have (average) angles of incidence $\theta_i$ and azimuthal angles $\phi_i$ and the other N beams are point-mirrored copies with (average) angles of incidence $\theta_i$ and azimuthal angles $\phi_i+180°$. In this way, for example, a 2D-periodic grating can be measured, or the $0^{th}$ order radiation may be mixed with radiation from other higher orders diffracted by the alignment grating.

Figure 6:
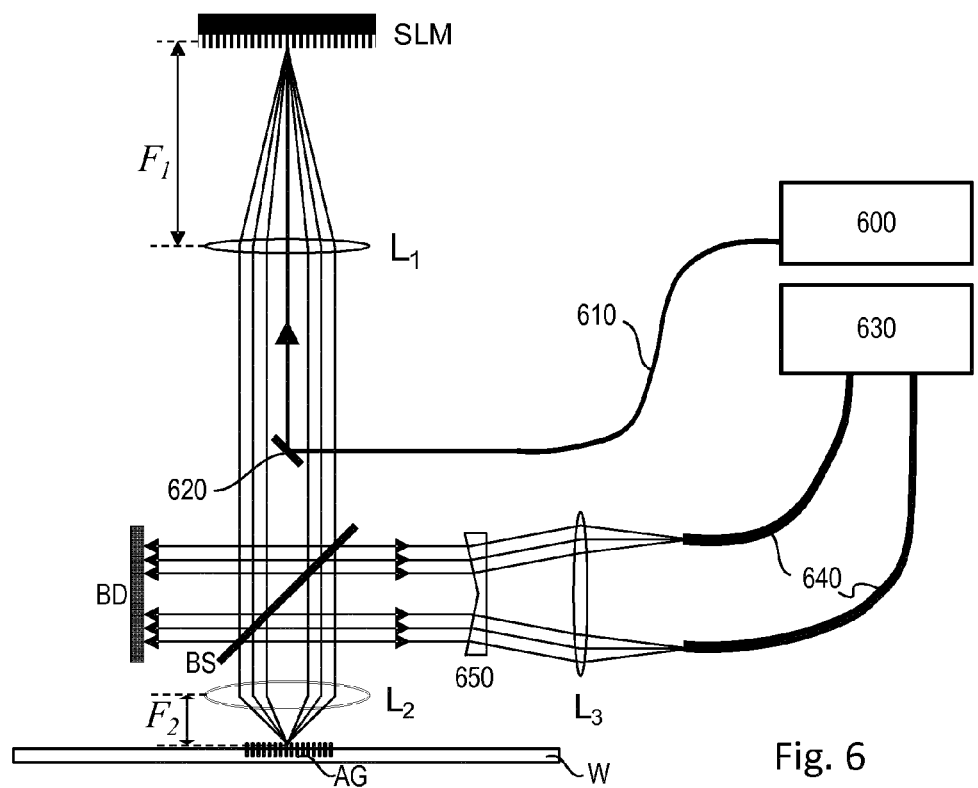
FIG. 6 depicts an alignment sensor according to a second embodiment of the invention.

FIG. 6 shows a more practical embodiment of the arrangement shown in FIG. 5. Here the illumination grating has been replaced by a spatial light modulator SLM so as to be programmable at high speed. This allows the pitch and orientation of the illumination grating to be changed in accordance with a change in pitch or orientation of the alignment grating AG, as alignment gratings of different pitches may be used on different layers of a lithographic process. Also the magnification of the lens system ($F_1/F_2$, where $F_1$ is the focal length of lens $L_1$, and where $F_2$ is the focal length of lens $L_2$) does not necessarily need to be unity (or may be adjustable). In this embodiment, overlapping $0^{th}$ and $1^{st}$ orders are obtained, for all wavelengths, when the pitch $P_{SLM}$ of the spatial light modulator SLM fulfills the following:

$$P_{SLM} = 2\frac{F_1}{F_2}P_{AG}$$

where $P_{AG}$ is the pitch of the alignment grating.

Alignment grating AG and the spatial light modulator SLM are shown here as being reflective (as they will be in most cases). Also shown is wafer W; beam splitter BS; beam dump BD; lens $L_2$; a super-continuum light source 600 delivered to the spatial light modulator SLM via single-mode illumination fiber 610 and spot mirror 620 (in the back-focal plane of lens $L_1$); and detection electronics 630 which pick up the optically amplified diffracted beams via multi-mode detection fibers 640, wedges 650 to spatially separate the amplified $+1^{st}$ and $-1^{st}$ diffraction orders; and lens $L_3$. Of course, this specific arrangement is shown purely for example and other optical elements, illumination sources or detection apparatuses may be used. The SLM, for example, may be replaced by a substrate comprising a number of different gratings having different pitches. In such an arrangement, selection of a particular pitch is performed by moving the appropriate grating to the location where it will be illuminated by the illumination source. Orientation of each grating may also be variable.

As a result of the spatial light modulator SLM dissipating some energy, and there being long path lengths comprised within the system, the spatial light modulator SLM may drift causing the system not to function properly. This can be addressed by replacing the beam dump with a reference branch which can monitor any displacement of the spatial light modulator SLM. Any apparatus able to monitor SLM drift may be used in the reference branch.

Figure 7:
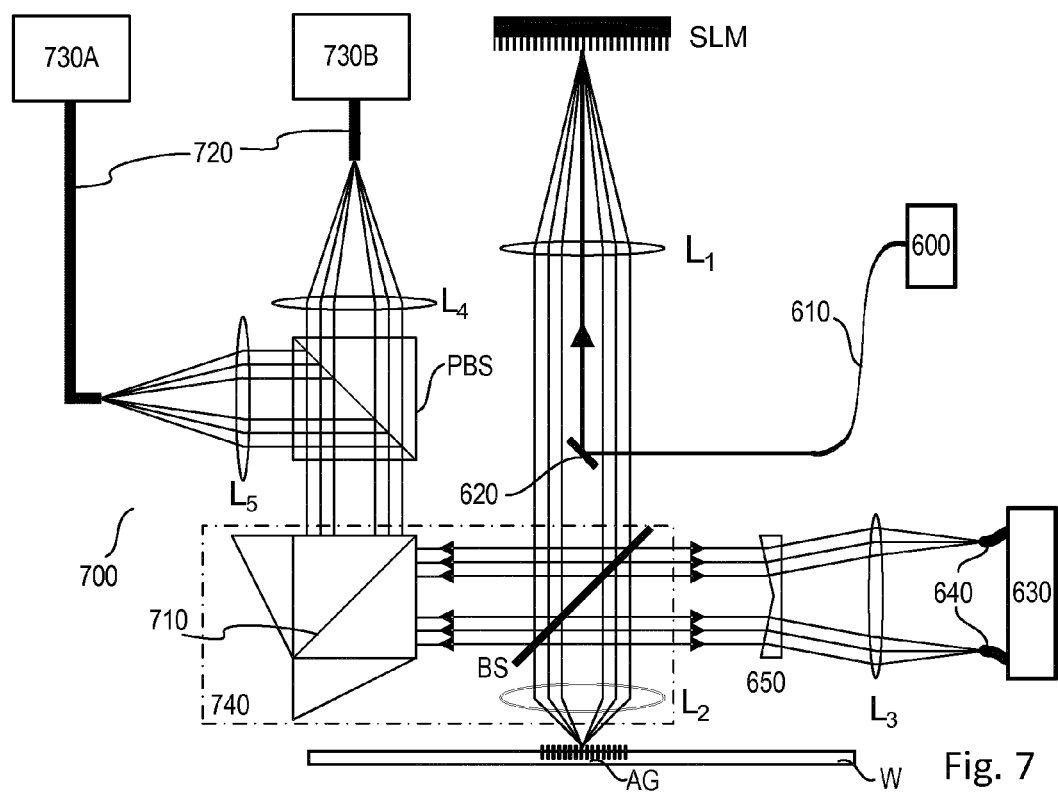
FIG. 7 depicts an alignment sensor according to a third embodiment of the invention.

FIG. 7 shows an example of such an arrangement comprising a reference branch 700. The reference branch 700 in this example comprises a self-referencing interferometer 710, polarising beam splitter PBS, lenses $L_4$, $L_5$ multi-mode detection fibers 720 and detection electronics 730A, 730B. The self-referencing interferometer may be as described in U.S. Pat. No. 6,961,116.

The self-referencing interferometer 710 is used to measure the phase difference between the illumination beams (such as beams $510_+$, $510_-$ in FIG. 5). The reference branch outputs two signals which vary in anti-phase as the phase difference varies. This phase difference directly shows up as a position error and should therefore be corrected. These two signals are detected using multi-mode detection fibers 720 and detection electronics 730A, 730B. By subtracting these two signals it is possible to measure SLM drift (from phase variations).

The reference branch can also be used to measure intensity noise in the source beams which can overwhelm the small $1^{st}$ order signals, allowing this noise to be removed from the detected signals. This is done by adding the two signals detected by detection electronics 730A, 730B.

Another advantage is that the apparatus 740 (comprising interferometer 710, lens $L_2$ and beam splitter BS) has a small critical volume. Only drift in the critical volume contributes to drift in the measured position. Drift outside the critical volume (e.g. SLM) is detected with the reference branch and can therefore be corrected. This means that it is easier to keep the alignment sensor stable at the nanometer scale.

While the techniques described above offer many advantages over the prior dark field techniques, backwards compatibility with present apparatuses is desirable. The apparatuses of FIG. 6 or 7 can be very simply modified to allow for a dark field alignment mode to be chosen.

Figure 8:
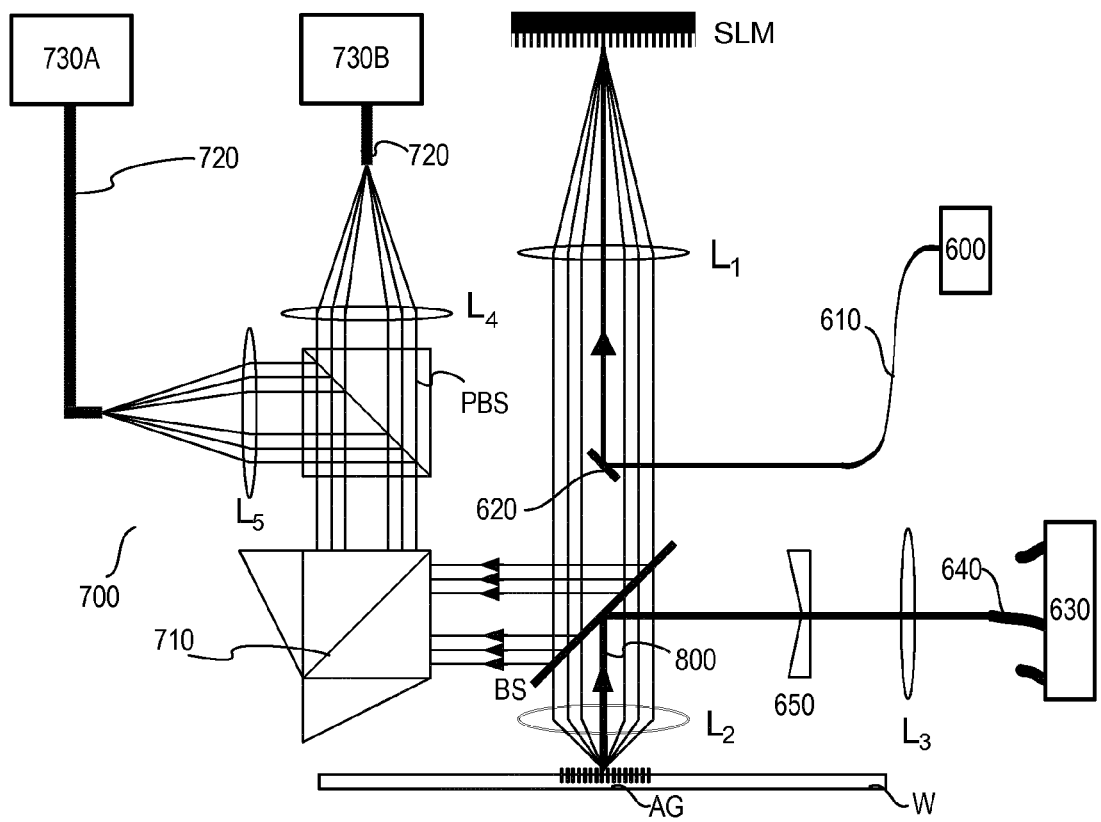
FIG. 8 depicts the alignment sensor of FIG. 7 operating in a dark mode configuration.

FIG. 8 illustrates such a mode. The spatial light modulator SLM is programmed (or illumination grating altered/selected) such that its pitch $P_{SLM}$ fulfills the following:

$$P_{SLM} = 2\frac{F_1}{F_2} P_{AG}$$

Where this is the case, the $+1^{st}$ and $-1^{st}$ diffraction orders 800 are both diffracted normal to the alignment grating AG where they interfere. The interfering $1^{st}$ diffraction orders 800 can then be picked-up by a detection fiber 640 and detected by the detection electronics 630. The optics in the path of the $1^{st}$ diffraction orders 800 may be modified slightly so as to allow the beam to pass unhindered (for example the wedge 650 may have an aperture in its center).

It is disclosed above that an SLM can be used in place of the illumination grating so as to allow the pitch and orientation of the illumination grating to be changed in accordance with a change in pitch or orientation of the alignment grating. However, it should be appreciated that the SLM is spatially quantized into indivisible grid elements with finite dimensions. This results in two potential issues:

The Alignment grating may have a pitch and/or duty cycle which cannot be properly reproduced due to the maximum resolution of the SLM. An example of this is where the desired pitch is not an integer multiple of the relevant dimension of an individual switchable element of the SLM. Another example is where the desired pitch is an odd integer multiple of the relevant dimension of an individual switchable element of the SLM.

The alignment grating may be orientated (around the optical axis of the homodyne alignment sensor) differently to the orientation of the SLM. This relative rotation between the alignment grating rotation and SLM rotation may be in the order of 22.5 or 45 degrees, for example. Where this is the case, the desired grating pattern may be orientated non-orthogonally to the SLM grid, and consequently the edges of each grating line may appear jagged.

In order to provide greater flexibility in the pitch and relative rotation it is proposed to grid snap the desired illumination grating pattern. In such an arrangement, any aspect of the grating such as pitch, duty cycle and/or orientation can be grid snapped to the (i.e. desired pitch and desired orientation) to the available individual switchable elements of the SLM. Grid snapping in this context is closely related to optical anti-aliasing techniques used, for example, in applications such as computer graphics and digital photography. In such applications, edges which ideally should appear straight, may appear jagged due to resolution limitations of the particular device being used. Anti-aliasing techniques limit this jagged appearance by essentially blurring the edges.

Figure 9:
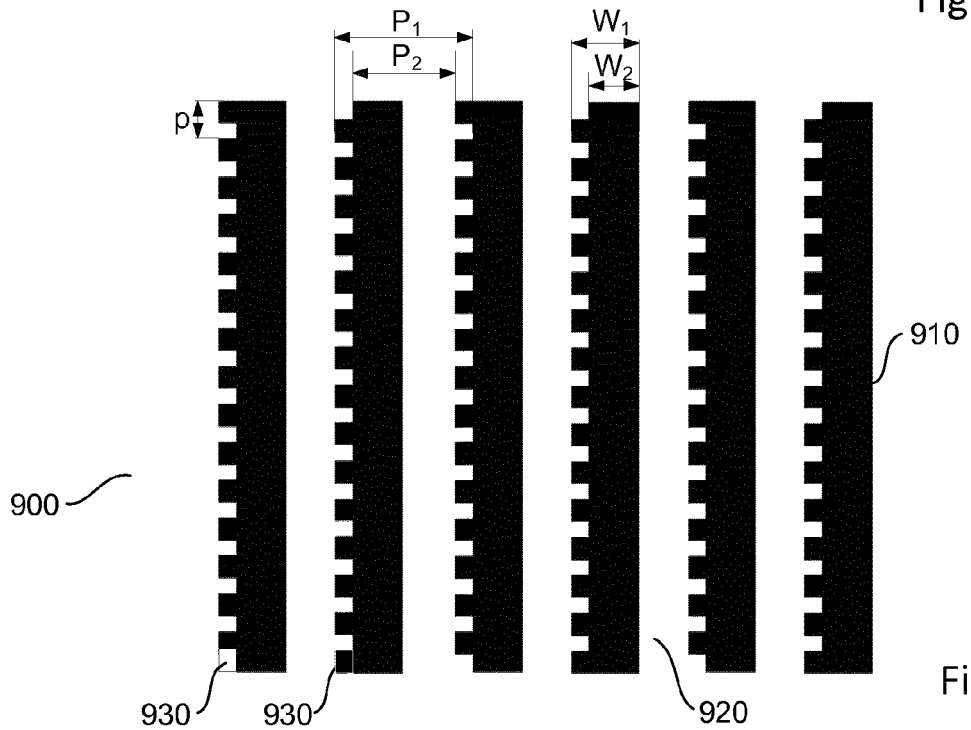
FIG. 9 depicts a first exemplary grid snapped SLM pattern approximating a grating having a pitch which is not an integer multiple of the individual SLM elements.

FIG. 9 shows a first exemplary grid snapped SLM pattern. The SLM pattern illustrated here approximates a grating pattern having a pitch which is not an even integer multiple of the individual SLM elements. It shows an SLM "grating" pattern 900 with the width of each individual pattern element (i.e. "grating" line 910), and the space 920 between each pair of "grating" lines 910, alternating between a first width $W_1$ and second width $W_2$, along their length. The difference between $W_2$ and $W_1$ may be, for example, the width of a single SLM element 930. This alternation is staggered for adjacent lines 910 such that the pitch alternates between $P_1$ and $P_2$ along the length of the grating 900. By appropriate selection of widths $W_1$ and $W_2$, and of pitches $P_1$ and $P_2$, a grating pattern which approximates (for example) a pitch (or duty cycle) not otherwise possible can be obtained.

In the specific example shown, the desired pitch is an odd integer multiple (e.g. 7) of the width of each individual element 930 which make up the SLM. Consequently, in order to render the pattern properly, each "grating" line 910, and each space 920 between pairs of "grating" lines 910 would need to have a width 3.5 times that of the width of each individual element 930. For example, consider an example where the width of each of the individual elements 930 that make up the SLM is 8 μm. Using such an SLM, it is simple to provide grating patterns with, for example, pitches of 32 μm or 48 μm (even multiples of 8 μm). However, the solution is not so straightforward when a pitch of 40 μm or 56 μm (odd multiples of 8 μm) is desired. According to this example, a pitch of 56 μm can be approximated by alternating the width of each "grating" line 910, and the space 920 between each pair of "grating" lines, along their length, between 24 μm and 32 μm (i.e. between 3 and 4 individual elements of the SLM). Providing the pitch p of this alternating width is small compared to the length of the "grating" line 910, the resulting grating pattern 900 will approximate a regular grating pattern of pitch $(P_1+P_2)/2$, which in this example is 56 μm. Here, the pitch p of this alternating width is as small as the SLM is able to resolve, and its duty cycle approximately 50%. Of course, all these values are provided for example and purely to illustrate the basic concept of the SLM grid snapping techniques disclosed herein.

It should be appreciated that the grid snapping techniques disclosed herein can be performed by means of modulating the amplitude, phase and/or polarization of the SLM radiation. The modulation/snapping can be performed in black and white as shown in FIG. 9, or using intermediary values (i.e. gray tones).

Figure 10:
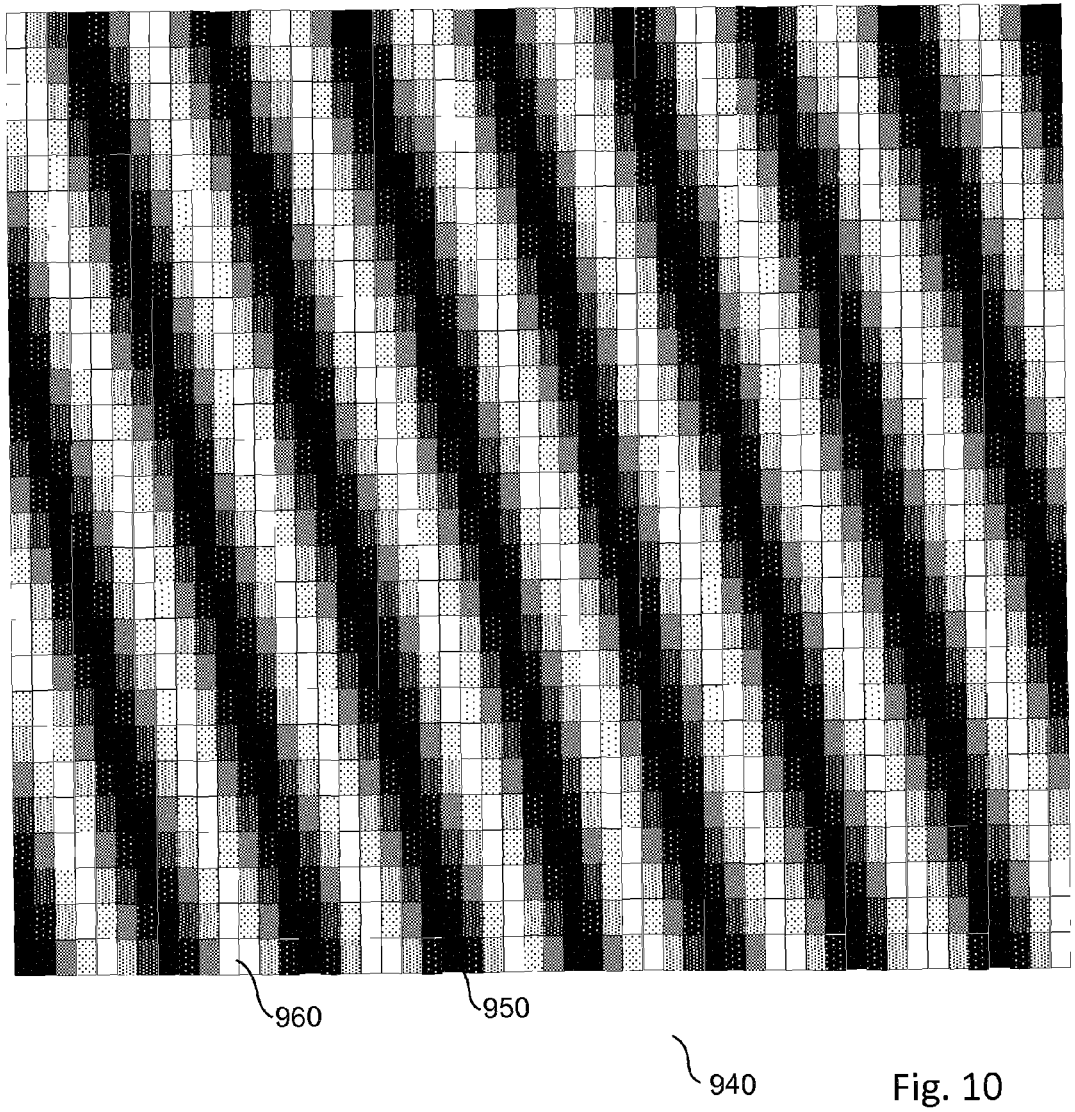
FIG. 10 depicts a second exemplary grid snapped SLM pattern approximating a grating having non-orthogonal orientation with respect to a grid defined by the individual SLM elements.

FIG. 10 shows a further embodiment of this grid snapping concept which uses intermediary values in order to better approximate a grating pattern 940 rotated through 22.5 degrees relative to the alignment grating, and therefore rotated relative to the SLM grid. In this embodiment, grid snapping techniques similar to anti-aliasing techniques are used to blur the line edges of each grating line 950. To do this, individual SLM elements at the line edges may be modulated with intermediate values (gray tones) which lie between the tone of central areas of the grating lines 950 and the tone of central areas of the spaces 960 between pairs of grating lines 950. Anti-aliasing filtering techniques can be used to do this.

It should be noted that the shape of the individual elements of the SLM are not necessarily restricted to a rectangular shape, and may comprise, for example also a hexagonal shape.

Current alignment techniques such as dark field techniques are not polarization-robust. Solutions having adjustable polarizing elements in the nanometer-critical path are "high risk". With the possibility of a small critical volume, the concepts described herein offer the further advantage of polarization flexibility. It is possible to select the illumination polarization by inserting an (adjustable) polarizing element in the illumination beam between the SLM and the beamsplitter. Also an (adjustable) polarizing element could be inserted in the detection path, in front of the detector. These elements may be adjustable as they are outside of the nanometer-critical path.

To summarise, advantages of the techniques described herein include:
- The ability to measure low-contrast (wafer quality—<0.01%) short alignment gratings (48 µm scan-length) at high speed (1 m/s) with a repro well below 1 nm).
- Inclusion of dark-field detection capability for backwards compatibility
- Arbitrary grating orientation. Pitch range is of the order of 0.6 µm-20 µm.
- Grating asymmetry information is already available in position measurement channel so there is no need for dedicated asymmetry detection hardware.
- Small critical volume that is rotationally symmetric and contains no critical beam stops or adjustable elements.
- Low stray light levels expected and no zero-order leakage effects.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, elements of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An alignment sensor comprising:
   an illumination source comprising a diffractive illumination structure operable to diffract higher order radiation at an angle dependent on wavelength; and
   illumination optics being operable to deliver said diffracted illumination radiation from said illumination source onto a point on a diffractive alignment structure from at least a pair of opposite azimuthal directions, wherein said alignment sensor is operable such that following diffraction of said illumination radiation by said diffractive alignment structure, and independent of the wavelength or wavelengths comprised in said illumination radiation:
   the zeroth diffraction order of radiation incident from a first of each pair of opposite azimuthal directions overlaps a higher diffraction order of radiation incident from a second of each pair of opposite azimuthal directions; and
   the zeroth diffraction order of radiation incident from the second of each pair of opposite azimuthal directions overlaps a higher diffraction order of radiation incident from the first of each pair of opposite azimuthal directions, wherein said higher diffraction orders are optically amplified with the overlapping zeroth orders.

2. An alignment sensor as claimed in claim 1 wherein said illumination source is a multi-wavelength illumination source and said alignment sensor is operable to optically amplify said higher diffraction orders with the overlapping zeroth orders for every component wavelength incident on said diffractive alignment structure.

3. An alignment sensor as claimed in claim 1 wherein the radiation incident on said diffractive alignment structure from said first and second directions of each pair of opposite azimuthal directions is coherent.

4. An alignment sensor as claimed in claim 1 wherein the diffractive illumination structure comprises a spatial light modulator.

5. An alignment sensor as claimed in claim 4 wherein the spatial light modulator is operable to modulate the amplitude, phase and/or polarization of the light it modulates.

6. An alignment sensor as claimed in claim 4 wherein the spatial light modulator is operable to grid snap a desired diffractive illumination structure pattern to a grid having indivisible grid elements defined by the individual switchable elements of the spatial light modulator.

7. An alignment sensor as claimed in claim 4 comprising a reference branch operable to measure drift in the spatial light modulator.

8. An alignment sensor as claimed in claim 7 wherein the reference branch comprises an interferometer operable to determine the phase difference between the radiation incident on said diffractive alignment structure from the first direction and from the second direction, of each pair of opposite azimuthal directions.

9. An alignment sensor as claimed in claim 1 being operable in a dark field mode in which the diffractive illumination structure has a pitch equal to that of said diffractive alignment structure, multiplied by a magnification factor of the illumination optics, such that the plus and minus first diffraction orders of the radiation incident on the diffractive alignment structures are emitted normal to the diffraction grating and interfere.

10. An alignment sensor as claimed in claim 1 comprising an adjustable polarizing element in the path of said diffracted illumination radiation or in the detection path of said alignment sensor.

11. An apparatus for use in a semiconductor production process comprising the alignment sensor as claimed in claim 1.

12. An apparatus as claimed in claim 11 comprising a lithographic apparatus being configured to generate a beam of radiation; and a projection system within a projection chamber and configured to project the beam of radiation onto a target portion of a substrate; wherein said alignment sensor is operable to detect diffractive alignment structures on said substrate.

13. An apparatus as claimed in claim 11 comprising an inspection apparatus for inspection of a substrate wherein said alignment sensor is operable to detect diffractive alignment structures on said substrate.

14. A method of performing an alignment operation on a substrate, said substrate comprising a diffractive alignment structure, said method comprising:

illuminating a diffractive illumination structure with illumination radiation; and receiving diffracted illumination radiation from said diffractive illumination structure and directing it onto a point on said diffractive alignment structure from at least a pair of opposite azimuthal directions, such that following diffraction of said radiation by said diffractive alignment structure, and independent of the wavelength or wavelengths comprised in said illumination radiation:

the zeroth diffraction order of radiation incident from the first of each pair of opposite azimuthal directions overlaps a higher diffraction order of radiation incident from the second of each pair of opposite azimuthal directions, and the zeroth diffraction order of radiation incident from the second of each pair of opposite azimuthal directions overlaps a higher diffraction order of radiation incident from the first of each pair of opposite azimuthal directions, wherein said higher diffraction orders are optically amplified with the overlapping zeroth orders.

15. A method as claimed in claim 14 wherein said illumination radiation comprises a plurality of component wavelengths and said optical amplification of said higher diffraction orders with the overlapping zeroth orders occurs for every component wavelength incident on said diffractive alignment structure.

16. A method as claimed in claim 14 wherein the radiation incident on said diffractive alignment structure from both first and second directions of each pair of opposite azimuthal directions is coherent.

17. A method as claimed in claim 14 wherein the diffractive illumination structure comprises a spatial light modulator.

18. A method as claimed in claim 17 comprising modulating the amplitude, phase and/or polarization of the light modulated by the spatial light modulator.

19. A method as claimed in claim 17 comprising grid snapping a desired diffractive illumination structure pattern to a grid having indivisible grid elements defined by the individual switchable elements of the spatial light modulator.

20. A method as claimed in claim 19 wherein said desired diffractive illumination structure pattern requires the width of one or more individual pattern elements of which the illumination structure pattern is comprised to have a value which is not an integer multiple of the relevant dimension of each indivisible grid element; and said method comprises approximating the individual pattern element(s) by varying, along the length of the individual pattern structure, the width of said individual pattern element(s) between values which are integer multiples of the relevant dimension of each indivisible grid element.

* * * * *